United States Patent
Matsuno et al.

(10) Patent No.: US 6,842,074 B2
(45) Date of Patent: Jan. 11, 2005

(54) BASE BIAS CIRCUIT, AND POWER AMPLIFIER USING THE BASE BIAS CIRCUIT

(75) Inventors: Noriaki Matsuno, Tokyo (JP); Tomohisa Hirayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/312,005

(22) PCT Filed: Jun. 20, 2001

(86) PCT No.: PCT/JP01/05269

§ 371 (c)(1),
(2), (4) Date: Jul. 9, 2003

(87) PCT Pub. No.: WO01/99272

PCT Pub. Date: Dec. 27, 2001

(65) Prior Publication Data

US 2004/0032700 A1 Feb. 19, 2004

(30) Foreign Application Priority Data

Jun. 20, 2000 (JP) .................................... 2000-183999

(51) Int. Cl.[7] .................................................. H03F 3/04
(52) U.S. Cl. ....................................... 330/296; 330/285
(58) Field of Search ................................. 330/296, 285, 330/135, 128

(56) References Cited

U.S. PATENT DOCUMENTS

| | | | | | |
|---|---|---|---|---|---|
| 5,268,649 | A | * | 12/1993 | Jones | 330/296 |
| 6,333,677 | B1 | * | 12/2001 | Dening | 330/296 |
| 6,690,237 | B2 | * | 2/2004 | Miyazawa | 330/285 |

FOREIGN PATENT DOCUMENTS

JP            09260964 A   * 10/1997   ............. H03F/3/19

* cited by examiner

*Primary Examiner*—James H. Cho
(74) *Attorney, Agent, or Firm*—Choate, Hall & Stewart

(57) ABSTRACT

A base bias circuit (1) operates like a constant voltage source, and a base bias voltage generated thereby varies according to fluctuation of the environment temperature without being influenced by the supply voltage, to hold a collector bias voltage constant. The base bias circuit (1) has a function of controlling the base bias voltage according to a control signal coming from the outside. By using a resistor (6) and resistor (14) having suitable resistances, the bipolar transistors constituting the bias circuit (1) can be small in size to reduce the electric current consumed by the bias circuit (1) thereby to make unnecessary the RF choke inductor between a power transistor (13) and the bias circuit (1). In short, the cost is lowered by making the chip size small and by reducing the number of external parts.

15 Claims, 7 Drawing Sheets

BASE BIAS CIRCUIT, AND POWER AMPLIFIER USING THE BASE BIAS CIRCUIT

CROSS REFERENCE TO RELATED APPLICATIONS

This application is a U.S. National Stage application of International Application No. PCT/JP01/05269, filed Jun. 20, 2001 and claims priority to Japanese Patent Application No. 2000-183999, filed Jun. 20, 2000.

FIELD OF THE INVENTION

This invention relates to a base bias circuit for use in a power amplifier and the power amplifier.

BACKGROUND OF THE INVENTION

A base bias circuit operating like a constant voltage source is indispensable for a power amplifier using a common-emitter bipolar transistor. The constant voltage source is more suitable than a constant current source as the bias circuit from the following reasons.

It is assumed that a RF input is applied to the common-emitter bipolar transistor given a bias to a base under the constant voltage source. In case where input RF power is sufficiently low, the common-emitter bipolar transistor operates with a low signal. Therefore, a collector current is equal to a collector bias current flowing in a such state that no signal is given to the amplifier.

On the contrary, as the input RF power is increased, the collector current of the common-emitter bipolar transistor is increased so as to reach several times or higher of the collector bias current. Due to the increase of the collector current, a higher saturation output and lower distortion can be realized.

In the meantime, in the case where the bias is given to the base under the constant current source, the collector current is constantly kept to hFE times of the base bias current, so that the collector current is not increased even if the input RF power is increased.

Accordingly, when the collector bias current is set in the same manner that the base bias is given under the constant voltage source, a gain compression upon a high-signal operation occurs under a lower input RF power. This degrades saturation characteristic, reduces additional power efficiency and deteriorates linearity.

Further, when the collector bias current is equal to the collector current under such a case that the base bias is given under the constant voltage source and the input RF power is high, a high collector current flows even when no RF signal is given or the input RF power is low. Therefore, consumption power is problematically increased.

From the aforementioned reasons, the base bias circuit operating like the constant voltage source is indispensable for the power amplifier using the common-emitter bipolar transistor. Specifically, an output resistance in a direct current state of the base bias circuit may be equal to or lower than a base input resistance in the direct current state of the common-emitter bipolar transistor of the amplifier.

For the base bias circuit, the following facts will be required.

At first, the bias voltage given to the base must be strictly specified because the common-emitter bipolar transistor has an extremely high mutual conductance gm.

Therefore, it is necessary that the base bias circuit has such a structure that a generated base bias voltage is not affected by fluctuation of a power supply voltage.

Moreover, the collector current of the common-emitter bipolar transistor is exponential function of temperature. Therefore, the base bias circuit must be constituted so that the generated base bias voltage is varied in dependence upon fluctuation of environment temperature to keep the collector bias current constant.

In a CDMA system portable phone, a transmission power must be controlled. In the base bias circuit, it is therefore required that the generated base bias voltage is functionally variable in accordance with a control signal from the external in order to reduce the consumption power of a power amplifier under a low transmission power.

FIG. 2 shows an example of a conventional base bias circuit.

A base bias circuit 52 is composed of an npn type bipolar transistors 53, 54, 55 and a resistor 56. All of the bipolar transistors 54, 55, 53 and 58 are manufactured by the same semiconductor process, and a ratio of emitter areas is set 1:n:1:n. A collector of the bipolar transistor 58 is directly connected to an RF load in a high-frequency state while it is directly connected to a power supply in a DC state.

Initially, consideration will be made of such a case that the RF input power is not given. In the circuit illustrated in FIG. 2, a portion consisting of the bipolar transistors 54, 55 and another portion consisting of the bipolar transistors 53, 58 are symmetrically constituted in the DC state except that the collector of the bipolar transistor 55 is connected to the base of the bipolar transistor 54 while the collector of the bipolar transistor 58 is directly connected to the power supply in the DC state.

Herein, if the voltage VCE between the emitter and the collector is 0.3–0.5 or higher, the portion consisting of the bipolar transistors 54, 55 and the portion consisting of the bipolar transistors 53, 58 are considered to be symmetrically and completely constituted in the DC state because the collector current of the bipolar transistor is not almost dependent upon VCE in general. Specifically, an emitter area ratio of the bipolar transistors 54, 55 and an emitter area ration of the bipolar transistors 53, 58 are 1:n, respectively.

Further, the base potential of the bipolar transistor 54 is kept equal to the base potential of the bipolar transistor 53. From the above-mentioned facts, the base-emitter voltage VBE of the bipolar transistor 55 is substantially equal to VBE of the bipolar transistor 58, and VBE of the bipolar transistor 54 is substantially equal to VBE of the bipolar transistor 53.

Therefore, the collector currents flowing along the bipolar transistors 55 and 58 are equal to each other while the collector currents flowing along the bipolar transistors 54 and 53 are also equal to each other. In this event, the bipolar transistor 53 placed in an output portion of the base bias circuit 52 forms an emitter follower. Taking this into consideration, it is found out that the output voltage of the bias circuit 52 is kept to a value lower with VBE than the base potential of the bipolar transistor 53. In other words, the base bias circuit operates like the constant voltage source.

In case where this fact is analyzed in more detail, the output resistance of the bias circuit 52, namely, the direct current resistance viewed the side of the bias circuit 52 from the emitter of the bipolar transistor 53 is substantially equal to a direct current base resistance of the power transistor 58.

In this event, it is assumed that hFE of the bipolar transistor is sufficiently high, and the base current of the bipolar transistor 54 and the base current of the bipolar transistor 53 are negligibly low for the collector current of the bipolar transistor 55.

The base potential of the bipolar transistor 54 is substantially equal to 2×VBE. In the case where a voltage given to a control terminal is set to Vref and a resistance value of the resistor 56 is set to R, the current flowing along the resistor 56 is given by (Vref-2×VBE)/R. This becomes the collector current of the bipolar transistor 55 in almost such a state.

As described above, the collector currents flowing along the bipolar transistors 55 and 58 are equal to each other. Taking this into consideration, the collector current of the bipolar transistor 58 is also equal to (Vref-2×VBE)/R. Therefore, it is found out that the collector current is not affected by the power source voltage.

Herein, VBE of the bipolar transistor is generally almost constant irrespective of the collector current. Taking this into account, it is confirmed that the collector current of the bipolar transistor 58 is controlled as linear function.

In this event, the bias voltage given to the base of the bipolar transistor is directly controlled. Taking this into consideration, the collector bias current becomes the exponential function, and therefore, slight fluctuation of the base bias voltage causes large fluctuation of the collector bias current.

In contrast, the collector bias current becomes the linear function of the control voltage in the base bias circuit 52, and therefore, the fluctuation of the collector bias current for the fluctuation of the control voltage is suppressed to a sufficiently low value.

Further, when the environment temperature is varied, the characteristic of each bipolar transistor is also varied. As mentioned above, in the circuit illustrated in FIG. 2, the portion consisting of the bipolar transistors 54, 55 and the portion consisting of the bipolar transistors 53 and the power transistor 58 are symmetrically constituted. To this end, the affect of the characteristic fluctuation of the bipolar transistor 54 and the affect of the characteristic fluctuation of the bipolar transistor 53 are canceled to each other while the affects of the characteristic fluctuations of the bipolar transistor 55 and the power transistor 58 are canceled to each other. As a result, such a structure is not readily subjected to the affect of the environment temperature.

However, the conventional technique illustrated in FIG. 2 has several problems.

As a first problem, the emitter area of the bipolar transistor 55 must be equal to the emitter size of the power transistor 58. Even if the power transistor, for example, has an output of about 1 W for use in the portable phone, a chip size is extremely large.

Therefore, the bias circuit comprising the bipolar transistor 58 having the same emitter as the power transistor 58 has the chip size larger than the power transistor 58.

As a second problem, the collector current flowing along the bipolar transistor 55 is equal to the collector bias current flowing along the power transistor 58. This means that the consumption current of the bias supply circuit 52 is substantially equal to the consumption current of the power transistor 58.

As a third problem, a choke inductor 62 is necessary between the bias supply circuit 52 and the power transistor 58 in order to prevent the RF signal from leaking to the bias circuit.

The output portion of the bias circuit 52 is structured by the emitter follower consisting of the bipolar transistor 53. Herein, the base potential of the bipolar transistor 53 is constantly kept to about 2×VBE by an operation of a circuit block. Taking this into account, it is found out that the output impedance of the emitter follower consisting of the bipolar transistor 53 is relatively low under high-frequency.

Accordingly, in order to prevent the input RF signal to the power transistor 58 from leaking to the side of the bias circuit, the choke inductor 62 is required. In the case where an exterior part is used as the choke inductor 62, a mounting cost and a cost for the exterior part is additionally necessary. In case where an inductor device formed on a semiconductor substrate is used as the choke inductor 62, the chip area is increased.

As the conventional technique for solving the first problem and the second problem, the ratio of the emitter areas of the bipolar transistors 54, 55, 53, 58 is set to 1:n:m:m×n in the bias circuit illustrated in FIG. 2.

In this case, the emitter area ratio of the bipolar transistors 54 and 55 is set to 1:n, the emitter area ratio of the bipolar transistors 53 and 58 is also set to 1:n, and the circuit block consisting of the bipolar transistors 54, 55 and the circuit block consisting of the bipolar transistors 53, 58 keeps symmetrical characteristic.

Therefore, functions required for the base bias circuit can be realized. Namely, the bias voltage given to the base is not affected by the fluctuation of the power supply voltage, the base bias voltage is varied in dependence upon the fluctuation of the environment temperature so as to keep the collector bias current constant, and the generated base bias voltage is variable in accordance with the control signal from the external.

Further, the collector current flowing along the bipolar transistor 55 becomes low with 1/m times of the collector current flowing along the power transistor 58, and therefore, the reduction of the consumption power can be realized. Moreover, the emitter area of the transistor having the largest emitter size becomes low with 1/m times, and therefore, the circuit area is reduced in accordance with a method of selecting m.

However, such a third problem that the choke inductor is necessary is not solved. Although the circuit area becomes lowest in the case of m=n, two transistor each having the emitter area of n is required, and there is a predetermined limit for reducing the area of the bias circuit.

Moreover, although the consumption current of the bias circuit becomes lowest in the case of n=1, the bipolar transistor having the same emitter area as the power transistor is necessary in the bias circuit, so that the circuit area is not reduced.

Thus, the conventional circuit has the limit for reducing the consumption current and area. Further, the choke inductor for preventing the leak of the RF power is indispensable between the base bias circuit and the power transistor, the exterior part and the additional mounting cost is necessary, or an on-chip inductor having a large area is required.

It is therefore an object of this invention to provide a base bias supply circuit which has a small chip area and a low consumption current without a choke inductor between a base of a power transistor and a bias supply circuit and which is for use in a bipolar transistor, and an amplifier circuit using the same.

Disclosure of this Invention

A base bias circuit according to this invention supplies a bias current to a base of a common-emitter bipolar transistor of an npn type for a power amplifier.

The base bias circuit comprises first through third bipolar transistors of an npn type and first and second resistors integrated on a semiconductor substrate and a base bias current control terminal.

The first resistor is inserted between the base bias current control terminal and the first bipolar transistor.

The second resistor is inserted between a base of the second bipolar transistor and the first bipolar transistor.

A base of the second bipolar transistor is connected to a collector of the third bipolar transistor.

An emitter of the second bipolar transistor is connected to a base of the third bipolar transistor.

An emitter of the third bipolar transistor is grounded. A collector of the first bipolar transistor is connected to a positive power supply. An emitter of the first bipolar transistor is directly connected to the base of the bipolar transistor for the power amplifier.

In this event, a third resistor may be inserted between a connection point of the first and second resistor and a base of the first bipolar transistor, and the emitter of the third bipolar transistor may be grounded via a fourth resistor.

Further, it may be short-circuited by the use of a metal wiring instead of the second resistor.

In addition, the first and second bipolar transistors may be replaced by n-type MOSFETs, and a buffer circuit may be inserted between the first resistor and the base bias current control terminal.

For example, the buffer circuit comprises a fourth bipolar transistor of an npn type and fifth and sixth resistors. An emitter of the fourth bipolar transistor is grounded and the base thereof is connected to the base bias current control terminal via the fifth resistor.

A collector of the fourth bipolar transistor is connected to the first resistor and the sixth resistor, and the sixth resistor is connected to a power supply terminal.

It is assumed that a resistance of a circuit consisting the first through third resistors and the second and third bipolar transistors, viewed from the base of the first bipolar transistor is defied as R, a mutual conductance of the first bipolar transistor is defined as gm and a common-emitter current amplification factor is defines as h21.

Under such a circumstance, an emitter area of the first bipolar transistor and resistances of the first through third resistors are selected such that an impedance given by (1/gm+R/(h21+1)) is higher than an impedance of the base of bipolar transistor for the power amplifier in a predetermined frequency band and is equivalent to an impedance of the base of the bipolar transistor for the power amplifier in a direct current.

The first through fourth bipolar transistors may be hetero junction bipolar transistors formed on an chemical substrate, and the first through fourth bipolar transistors may be Si homo BJTs formed on a Si substrate.

The first through fourth bipolar transistors may be SiGe hetero junction bipolar transistors formed on a Si substrate.

Further, the bipolar transistor for the power amplifier is formed on the same semiconductor substrate as the base bias circuit, and the base bias circuit and the bipolar transistor for the power amplifier are connected by a metal wiring formed by a semiconductor production process to constitute the power amplifier.

BEST MODE EMBODYING THIS INVENTION

Hereinafter, this invention will be explained with reference to the drawings.

Figure 1:
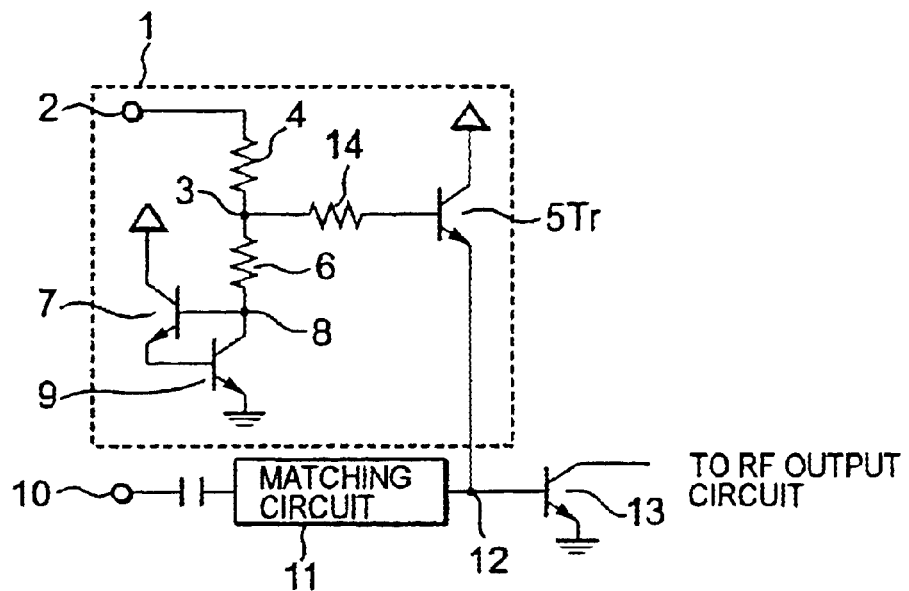
FIG. 1 shows an example of a power amplifier according to this invention.
Figure 3:
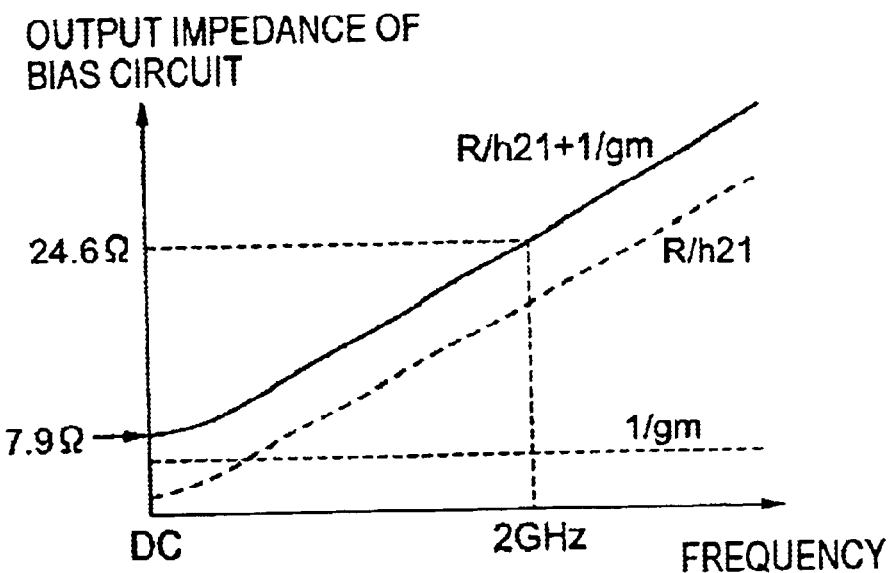
FIG. 3 is a diagram for explaining an operation of a power amplifier illustrated in FIG. 1.
Figure 4:
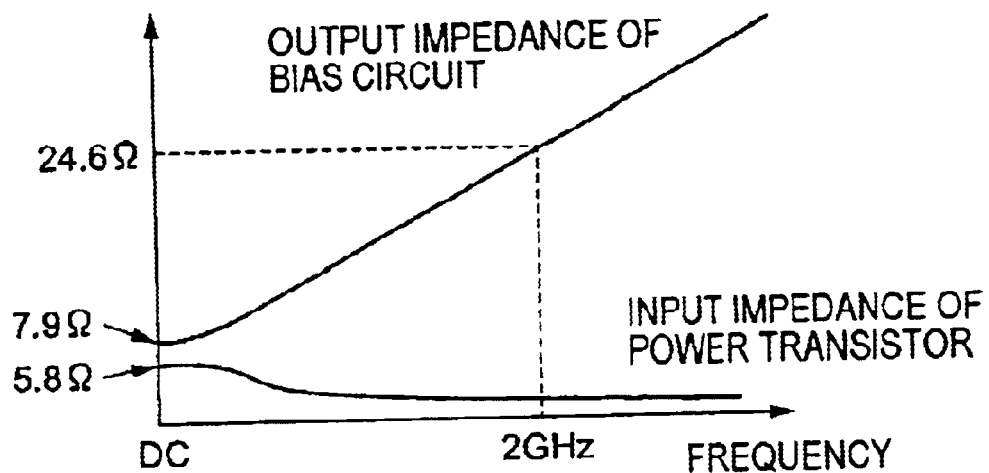
FIG. 4 is a diagram for explaining an operation of a power amplifier illustrated in FIG. 1.

At first, referring to FIG. 1, FIG. 3 and FIG. 4, a base bias circuit 1 is composed of npn type bipolar transistors 5, 7, 9 and resistors 4, 6, 14 integrated on the same semiconductor substrate.

An emitter of the transistor 5 is directly connected to a base of the power transistor 13 without an inductor for an RF choke and resistors. A matching circuit consisting of the base bias circuit 1, the power transistor 13 and a passive device are fabricated on the same gallium arsenide substrate so as to totally constitute an MMIC amplifier.

Further, each of the bipolar transistors 5, 7, 9 is GaAs/AlGaAs hetero junction bipolar transistor (HBT) produced by the same process.

An area ratio of the bipolar transistors 5, 7, 9 is set to 5:1:1:30, and an emitter dimension of the bipolar transistor 7, 9 having a smallest emitter area is set to a smallest dimension permitted in the process. The total of the emitter areas of the transistors constituting the base bias circuit 1 is smaller than that of the conventional technique.

Description will be made about an operation of an amplifier circuit illustrated in FIG. 1.

A potential of a node 8 connected to the base of the bipolar transistor 7 is equal to the total of VBE of the bipolar transistor 9 and VBE of the bipolar transistor 7. In the amplifier device, a collector current density of the bipolar transistor 9 is designed so as to be equal to a collector current density of the power transistor 13.

Therefore, VBE of the bipolar transistor 9 is equal to VBE of the power transistor 13. Further, the collector current of the power transistor 13 is higher with 30 times than the collector current of the bipolar transistor 9. Accordingly, the base current of the power transistor 13 is higher with 30 times than the base current of the bipolar transistor 9.

The base current of the bipolar transistor 13 is equal to the emitter current of the bipolar transistor 5. The base current of the bipolar transistor 9 is equal to the emitter current of the bipolar transistor 7. In addition, the emitter area of the bipolar transistor 5 is five times of that of the bipolar transistor 7, and therefore, the collector current density of the bipolar transistor 5 becomes six times of the collector current density of the bipolar transistor 7.

Therefore, VBE of the bipolar transistor 5 is higher than VBE of the bipolar transistor 7. Herein, the collector current of the bipolar transistor is generally proportional to exp (q×VBE/(k×T)), and taking this into account, it is necessary that VBE of the bipolar transistor 5 is higher with k×T×ln (6)/q than VBE of the bipolar transistor 7, and higher with about 47 mV in the room temperature.

The resistance value of the resistor 6 and the resistor 14 is selected such that a voltage drop due to the resistor 6 in a standard operation state is higher with 47 mV than the voltage drop due to the resistor 14.

Herein, explanation will be made of a current value and a circuit constant of each portion in a typical operation state of the amplifier circuit illustrated in FIG. 1.

The collector current when the RF input power is zero, namely, the collector bias current is 135 mA, and the collector current of the bipolar transistor 9 is 4.5 mA. The collector current density of the bipolar transistor 9 is equal to the collector bias current density of the power transistor 13. Since the emitter area of the bipolar transistor 9 is set to a smallest area permitted in the process, the consumption current of the bias circuit is minimized.

The GaAs/AlGaAs hetero junction bipolar transistor for use in the semiconductor device illustrated in FIG. 1 has hFE of approximately 30. Accordingly, the emitter current of the bipolar transistor 7 is 0.15 mA, and the base current of the bipolar transistor 7 is 0.005 mA. Further, the emitter current of the bipolar transistor 5 is 4.5 mA, and the base current of the bipolar transistor 5 is 0.15 mA.

Therefore, the base current of the bipolar transistor 7 and the base current of the bipolar transistor 5 are sufficiently negligibly low for the collector current of the bipolar transistor 9. Moreover, the current of 4.5 mA equal to the collector current of the bipolar transistor 9 flows along the resistor 4. The resistance value of the resistor 6 is 12 Ω, and the voltage drop due to the resistor 6 becomes 54 mV.

By contrast, the resistance value of the resistor 14 is 47 Ω, and the voltage drop due to the resistor 14 is 7 mV. The difference between the voltage drop due to the resistor 6 and the voltage drop due to the resistor 14 becomes 47 mV. The resistance value of the resistor 4 becomes 100 Ω.

The collector current of the bipolar transistor 9 is substantially equal to the current flowing along the resistors 4, 6. Herein, the potential of the node 8 is equal to 2.7 V as the total of the VBE of the bipolar transistor 9 and VBE of the bipolar transistor 7, and the fluctuation of such a voltage is small even if the collector current of the bipolar transistor 9 is fluctuated. Taking this into consideration, the collector current IC 9 of the bipolar transistor 9 is represented by IC=(Vref-2.7)/(100+12) by using the voltage V given to the control terminal 2, so that IC 9=4.5 mA is obtained in the case of Vref=3.2V.

In this event, the collector bias current density of the bipolar transistor 13 is equal to that of the bipolar transistor 9 and the collector bias current of the power transistor 13 becomes 135 mA. Herein, it is found out that the bias circuit is not affected by the power supply voltage in such a structure because the power supply voltage does not appear in the equation for giving IC 9.

Moreover, when the environment temperature is fluctuated, characteristic of each bipolar transistor is also fluctuated. In the circuit shown in FIG. 1, a portion consisting of the bipolar transistors 7, 9 and a portion consisting of the bipolar transistor 5 and the power transistor 13 are substantially symmetrical in the structure. Therefore, the affect of the characteristic fluctuation of the bipolar transistor 7 and the affect of the characteristic fluctuation of the bipolar transistor 13 are cancelled while the affects of the characteristic fluctuations of the bipolar transistor 9 and the power transistor 5 are cancelled. As a consequence, the structure is not readily subjected to the affect of the environment temperature. In the circuit shown in FIG. 1, however, the symmetrical characteristic of the circuit is destroyed because the voltage drops due to the resistor 6 and the resistor 14 is utilized.

Figure 2:
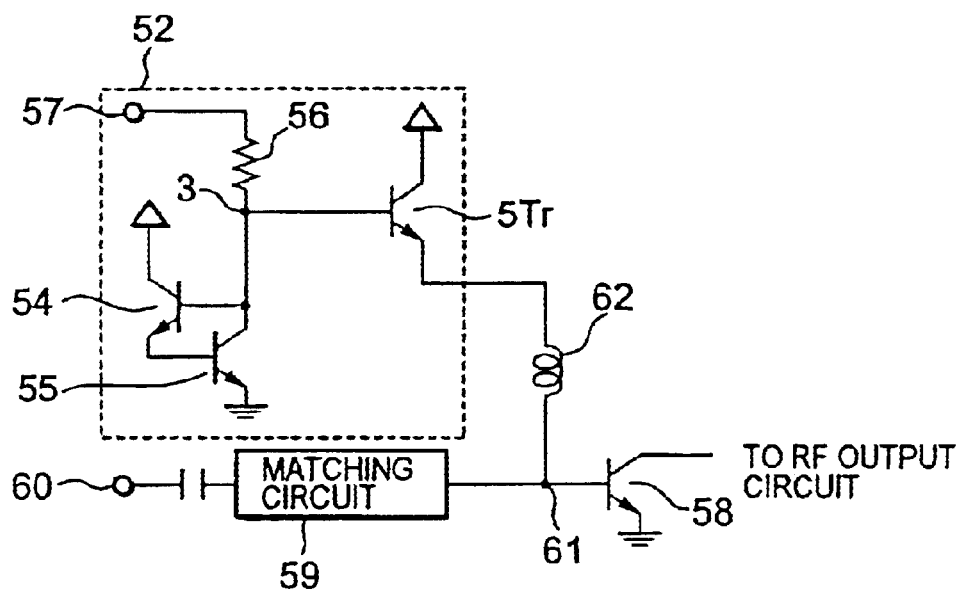
FIG. 2 is a diagram for explaining a conventional base bias circuit.

Therefore, the circuit is readily subjected to the affect of the environment temperature compared with the conventional circuit illustrated in FIG. 2. However, the voltage drops of the resistor 6 and the resistor 14 are 54 mV and 7 mV, respectively, and are sufficiently low in comparison with typical values (1.2–1.4 V) of VBE of the GaAs/AlGaAs hetero junction bipolar transistor.

Therefore, deterioration of resistance for the environment temperature fluctuation due to the insertion of the resistor 6 and the resistor 14 is sufficiently low.

Herein, when the resistance of the circuit consisting of the resistors 4, 6, 14 viewed from the base of the bipolar transistor 5 is defined as R, the mutual conductance of the bipolar transistor 5 is defined as gm, and the common-emitter current amplification factor is defined as h21, the impedance of the base bias circuit 1 viewed the side of the bipolar transistor 5 from the node 12 is given by (1/gm+R/(h21+1)). gm of the bipolar transistor is given by q×IC/(k×T) using the collector current IC. Since the collector current of the bipolar transistor 5 is 4.5 mA, 1/gm is equal to 5.8 Ω.

On the other hand, h21 is substantially equal to hFE under a low frequency, is varied with a ratio of −6 dB /oct. under a high frequency, and an absolute value of h21 is equal to 1 when the frequency is a cutoff frequency fT. When the collector current of the bipolar transistor 5 is 4.5 mA, fT is about 5 GHz. Therefore, h21 is about 2.5 in 2 GHz as the band of the amplifier.

The resistance value of the circuit consisting of the bipolar transistors 7, 9 viewed from the node 8 is twice of reciprocal of gm of the bipolar transistor 9. Herein, gm of the bipolar transistor is given by q×IC/(k×T) and the collector current of the bipolar transistor 9 is 4.5 mA. Taking this into consideration, the resistance value of the circuit consisting of the bipolar transistors 7, 9 viewed from the node 8 is equal to 11.6 Ω.

If it is assumed that the voltage source is connected to the control terminal 2, the resistance R of the circuit consisting of the resistors 4, 6, 14 and the bipolar transistors 7, 9 viewed from the base of the bipolar transistor 5 becomes 47+1/(1/100+1/(12+11.6))=6.1 Ω.

As mentioned above, the impedance viewed the side of the bipolar transistor 5 from the node 12 is given by (5.8+66.1/(h21+1)). Since h21=hFE=30 is given under the direct current, the impedance becomes h21=2.5 under 7.9 Ω, 2 GHz. Therefore, the impedance is equal to 24.7 Ω.

A schematic diagram of frequency characteristic of this impedance is shown in FIG. 3.

In order to increase the impedance under the high frequency of the base bias circuit 1 viewed the side of the bipolar transistor 5 from the node 12, the resistance value of the resistor 15 must be increased.

By simultaneously optimizing the resistance value of the resistor 6, the difference between the voltage drop due to the resistor 6 and the voltage drop due to the resistor 14 can be kept to a desired value, namely, to 47 mV in this case.

In this event, attention is paid for the impedance of the base of the power transistor 13. Under the direct current, the impedance of the base is represented by hFE/gm=hFE×k×

T/(q×IC/)=30×0.026/0.135=5.8 Ω. This value is equivalent to a value (7.9 Ω) of the impedance under the direct current viewed the side of the bipolar transistor 5 from the node 12 of the base bias circuit 1.

Therefore, the base bias circuit 1 operates like the voltage source under the direct current. In the meantime, the impedance of the base of the power transistor 13 under the high frequency is reduced to about ⅓ of the value (5.8 Ω) under the direct current by the affect of the capacitor.

By contrast, the value of the impedance under 2 GHz viewed the side of the bipolar transistor 5 from the node 12 of the base bias circuit 1 is equal to 24.7 Ω, and is equal to ten times of the impedance of the base of the power transistor 13 or higher.

Therefore, the leak to the base bias circuit 1 of the signal power in the 2 GHz band given to the power transistor 13 can be lowery suppressed without using the RF choke inductor between the power transistor 13 and the bias circuit 1. The schematic diagram of the frequency characteristic of this impedance is shown in FIG. 4.

In summary, the base bias circuit 1 illustrated in FIG. 1 according to this invention can realize the facts required for the base circuit for use in the power amplifier using the common-emitter bipolar transistor. Namely, the base bias circuit 1 operates like the constant voltage source, the generated base bias voltage is not subjected to the affect of the fluctuation of the power supply voltage, the generated bias voltage is varied in dependence upon the environment temperature fluctuation so as to keep the collector base current constant, and the base bias voltage generated in accordance with the control signal from the external is variable.

Further, in the amplifier circuit using this invention, the resistor 6 and the resistor 14 are added, and the difference between the voltage drop due to the resistor 6 and the voltage drop due to the resistor 14 is set to 47 mV, and thereby, the emitter area ratio of the bipolar transistors 7, 9 is set to 1:1 while the emitter area ratio of the bipolar transistor 5 and the power transistor 13 is set to 5:30, so that the symmetrical characteristic of the circuit is destroyed in such a structure.

As a consequence, the size of each bipolar transistor constituting the bias circuit 1 is smaller than that of the amplifier according to the conventional technique, and the current consumed by the bias circuit 1 is reduced also. Moreover, by selecting the values of the resistors 6 and 14 to suitable values, namely, 12 Ω and 47 Ω in the amplifier illustrated in FIG. 1, the impedance of the base bias circuit 1 under the high frequency viewed the side of the bipolar transistor 5 from the node 12 can be sufficiently higher than the impedance of the base of the power transistor 13.

Therefore, the leak to the base bias circuit 1 of the high frequency signal power given to the power transistor 13 can be lowery suppressed without inserting the RF choke inductor between the power transistor 13 and the bias circuit 1.

Specifically, the cost reduction due to the reduction of the exterior parts as well as the reduction of the chip size due to the reduction of the on-chip inductors can be achieved.

Subsequently, referring to FIG. 5, a base bias circuit 15 is composed of an npn type GaAs/AlGAs hetero junction bipolar transistors 19, 20, 21 and resistors 17, 18. Integrated on the same semiconductor substrate An emitter of the transistor 21 is directly connected to the base of the npn type GaAs/AlGaAs hetero junction bipolar transistor 22 without an inductor and a resistor for the RF choke.

A matching circuit 23 consisting of the base bias circuit 15, the power transistor 22 and a passive device is manufactured on the same gallium arsenide substrate to totally constitute an MMIC amplifier.

The emitter area ratio of the bipolar transistors 19, 20, 21, 22 is set to 1:1:10:100, and the emitter dimension of the bipolar transistor 19, 20 having a smallest emitter area is set to a minimum dimension permitted in the process.

The total of the emitter areas of the transistors constituting such a base bias circuit 15 is smaller than that in case using the conventional technique.

Figure 5:
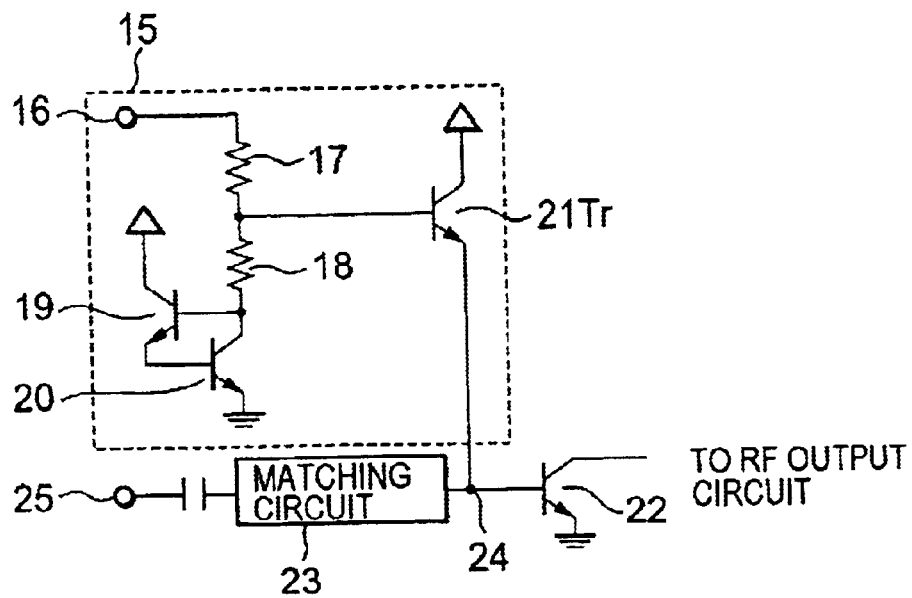
FIG. 5 is the other example of a power amplifier according to this invention.

The base bias circuit 15 illustrated in FIG. 5 can realize the facts required for the base circuit for use in the power amplifier using the common-emitter bipolar transistor. Namely, the base bias circuit 15 operates like the constant voltage source, the generated base bias voltage is not subjected to the affect of the fluctuation of the power supply voltage, the generated bias voltage is varied in dependence upon the environment temperature fluctuation so as to keep the collector base current constant, and the base bias voltage generated in accordance with the control signal from the external is variable.

Further, in the semiconductor device illustrated in FIG. 5, the resistor 18 is added, and the voltage drop due to the resistor 18 is suitably set and thereby, the emitter area ratio of the bipolar transistors 19, 20 is set to 1:1 while the emitter area ratio of the bipolar transistor 21 and the power transistor 22 is set to 10:100, so that the symmetrical characteristic of the circuit is destroyed in such a structure.

As a consequence, the size of each bipolar transistor constituting the bias circuit 15 is smaller than that of the semiconductor device according to the conventional technique, and the current consumed by the bias circuit 15 is reduced also. In the semiconductor device illustrated in FIG. 5, the resistance of the resistor 14 of the semiconductor device shown in FIG. 1 is equal to zero Ω in such a structure.

However, the emitter area of each bipolar transistor and the values of the resistors 17, 18 are suitably balanced, and as a result, the impedance of the base bias circuit 15 under the high frequency viewed the side of the bipolar transistor 21 from the node 24 is sufficiently higher than the impedance of the base of the power transistor 22, even if the resistor 14 is omitted.

Accordingly, the leak to the base bias circuit 1 of the high frequency signal power given to the power transistor 22 can be lowery suppressed without inserting the RF choke inductor between the power transistor 22 and the bias circuit 15.

Specifically, the cost reduction due to the reduction of the exterior parts and the reduction of the chip size due to the reduction of the on-chip inductors can be achieved.

Figure 6:
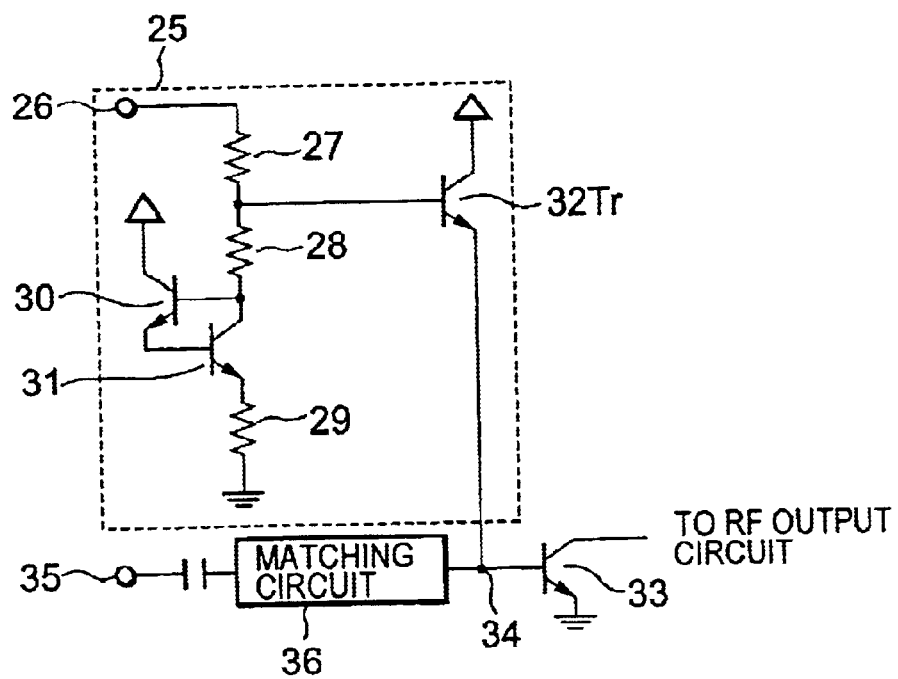
FIG. 6 is the other example of a power amplifier according to this invention.

Referring to FIG. 6, a base bias circuit 25 is composed of an npn type Si homo bipolar transistor 30,31,32 and resistors 27, 28 integrated on the same semiconductor substrate An emitter of the transistor 32 is directly connected to the base of the npn type Si homo power transistor 33 without an inductor and a resistor for the RF choke.

The base bias circuit 25 and the power transistor 33 are manufactured on the same Si substrate to constitute an MMIC externally added to a matching circuit.

A matching circuit 36 consisting of the passive devices is manufactured on a dielectric substrate. In the semiconductor device shown in FIG. 6, the resistor 29 is added to the semiconductor device illustrated in FIG. 5. Since the resistor 28 and the resistor 29 are equivalent with respect to the circuit operation, the operation of the semiconductor device shown in FIG. 6 is the same as that of the semiconductor device shown in FIG. 5 in principle.

In other words, the base bias circuit 25 illustrated in FIG. 6 can realize the facts required for the base circuit for use in the power amplifier using the common-emitter bipolar transistor. Namely, the base bias circuit 25 operates like the constant voltage source, the generated base bias voltage is not subjected to the affect of the fluctuation of the power supply voltage, the generated bias voltage is varied in dependence upon the environment temperature fluctuation so as to keep the collector base current constant, and the base bias voltage generated in accordance with the control signal from the external is variable.

Further, in the semiconductor device illustrated in FIG. 6, the resistors 28, 29 are added, and the voltage drop due to the resistors 28, 29 is suitably set and thereby, the symmetrical characteristic between the emitter area ratio of the bipolar transistors 30, 31 and the emitter area ratio of the bipolar transistor 32 and the power transistor 33 is destroyed in such a structure.

As a consequence, the size of each bipolar transistor constituting the bias circuit 25 is smaller than that of the semiconductor device according to the conventional technique, and the current consumed by the bias circuit 25 is reduced also. Further, the impedance of the base bias circuit 25 under the high frequency viewed the side of the bipolar transistor 32 from the node 34 is sufficiently higher than the impedance of the base of the power transistor 33.

Therefore, the leak to the base bias circuit 25 of the high frequency signal power given to the power transistor 33 can be lowery suppressed without inserting the RF choke inductor between the power transistor 33 and the bias circuit 25.

Specifically, the cost reduction due to the reduction of the exterior parts and the reduction of the chip size due to the reduction of the on-chip inductors can be achieved.

Figure 7:
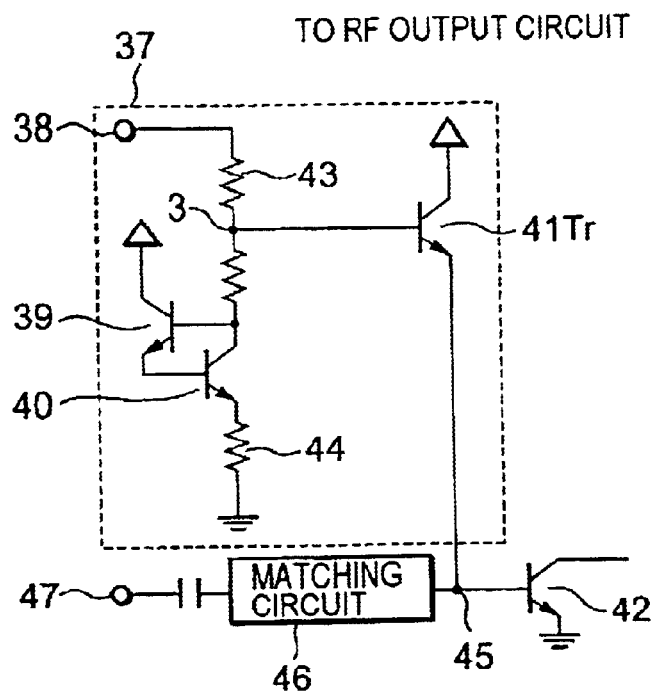
FIG. 7 is the other example of a power amplifier according to this invention.

Referring to FIG. 7, a base bias circuit 37 is composed of an npn type SiGe base bipolar transistor 39,40,41 and resistors 43, 44 integrated on the same semiconductor substrate.

An emitter of the transistor 41 is directly connected to the base of the npn type SiGe base power transistor 42 without an inductor for and a resistor for the RF choke.

The base bias circuit 37 and the power transistor 42 are manufactured on the same Si substrate to constitute an MMIC externally added to a matching circuit. A matching circuit 46 consisting of passive devices is manufactured on a dielectric substrate.

In the semiconductor device shown in FIG. 7, the resistor 28 of the semiconductor device illustrated in FIG. 5 is omitted. Since the resistor 28 and the resistor 29 are equivalent with respect to the circuit operation, the operation of the semiconductor device shown in FIG. 7 is the same as that of the semiconductor device shown in FIG. 6 in principle.

In other words, the base bias circuit 37 illustrated in FIG. 7 can realize the facts required for the base circuit for use in the power amplifier using the common-emitter bipolar transistor. Namely, the base bias circuit 25 operates like the constant voltage source, the generated base bias voltage is not subjected to the affect of the fluctuation of the power supply voltage, the generated bias voltage is varied in dependence upon the environment temperature fluctuation so as to keep the collector base current constant, and the base bias voltage generated in accordance with the control signal from the external is variable.

Further, in the semiconductor device illustrated in FIG. 7, the resistor 44 is added, and the voltage drop due to the resistor 44 is suitably set and thereby, the symmetrical characteristic between the emitter area ratio of the bipolar transistors 39, 40 and the emitter area ratio of the bipolar transistor 41 and the power transistor 42 is destroyed in such a structure.

As a consequence, the size of each bipolar transistor constituting the bias circuit 37 is smaller than that of the semiconductor device according to the conventional technique, and the current consumed by the bias circuit 37 is reduced also. Further, the impedance of the base bias circuit 37 under the high frequency viewed the side of the bipolar transistor 41 from the node 45 is sufficiently higher than the impedance of the base of the power transistor 42.

Therefore, the leak to the base bias circuit 37 of the high frequency signal power given to the power transistor 42 can be lowery suppressed without inserting the RF choke inductor between the power transistor 42 and the bias circuit 37.

Specifically, the cost reduction due to the reduction of the exterior parts and the reduction of the chip size due to the reduction of the on-chip inductors can be achieved.

Figure 8:
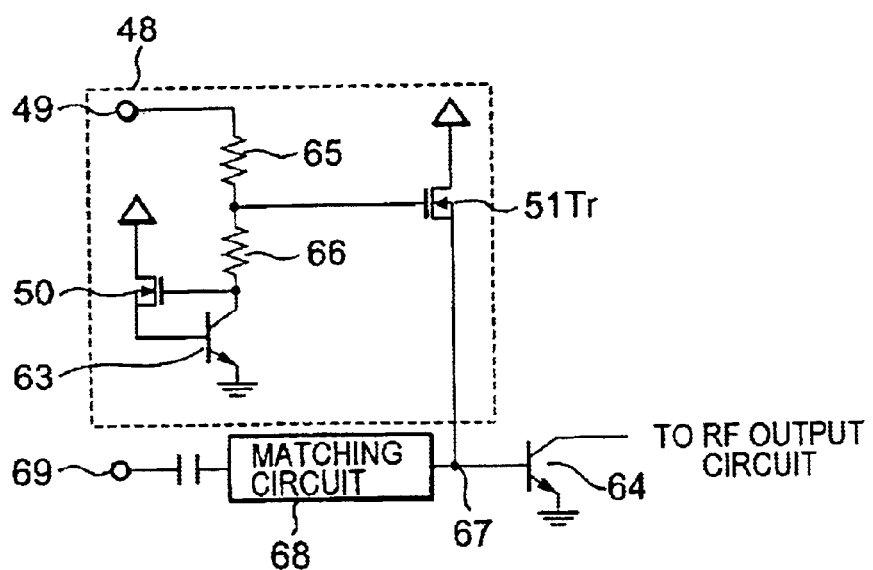
FIG. 8 is the other example of a power amplifier according to this invention.

Referring to FIG. 8, a base bias circuit 48 is composed of n-channel MOSFETs 50, 51, an npn type Si homo bipolar transistor 63 and resistors 65, 66 integrated on the same semiconductor substrate. A source of the MOSFET 51 is directly connected to the base of the npn type Si homo power transistor 64 without an inductor and a resistor for a RF choke.

The base bias circuit 48 and the power transistor 64 are manufactured on the same Si substrate to constitute an MMIC externally added to a matching circuit. A matching circuit 68 consisting of the passive devices is manufactured on a dielectric substrate.

In the semiconductor device shown in FIG. 8, the bipolar transistors 5, 7 of the semiconductor device shown in FIG. 5 are replaced with the MOSFETs 50, 51. In the semiconductor device illustrated in FIG. 8, the circuit portion consisting of the MOSFET 50 and the bipolar transistor 63 and the circuit portion consisting of the MOSFET 51 and the bipolar transistor 64 has the symmetrical structure, and therefore, the operation of the semiconductor device shown in FIG. 8 is the same as that of the semiconductor device shown in FIG. 5 in principle.

In other words, the base bias circuit 48 illustrated in FIG. 8 can realize the facts required for the base circuit for use in the power amplifier using the common-emitter bipolar transistor. Namely, the base bias circuit 48 operates like the constant voltage source, the generated base bias voltage is not subjected to the affect of the fluctuation of the power supply voltage, the generated bias voltage is varied in dependence upon the environment temperature fluctuation so as to keep the collector base current constant, and the base bias voltage generated in accordance with the control signal from the external is variable.

Further, in the semiconductor device illustrated in FIG. 8, the resistors 65, 66 are added, and the voltage drop due to the resistors 65, 66 is suitably set and thereby, the symmetrical characteristic between the ratio of the gate width of the MOSFET 50 and the emitter area ratio of the bipolar transistor 63 and the ratio of the gate width of the MOSFET 51 and the emitter area ratio of the bipolar transistor 64 is destroyed in such a structure.

As a consequence, the size of each bipolar transistor constituting the bias circuit 48 is smaller than that of the semiconductor device according to the conventional technique, and the current consumed by the bias circuit 48 is reduced also. Further, the impedance of the base bias circuit 48 under the high frequency viewed the side of the MOSFET 51 from the node 67 is sufficiently higher than the impedance of the base of the power transistor 64.

Therefore, the leak to the base bias circuit 48 of the high frequency signal power given to the power transistor 64 can be lowery suppressed without inserting the RF choke inductor between the power transistor 64 and the bias circuit 48.

Specifically, the cost reduction due to the reduction of the exterior parts added and the reduction of the chip size due to the reduction of the on-chip inductors can be achieved.

Figure 9:
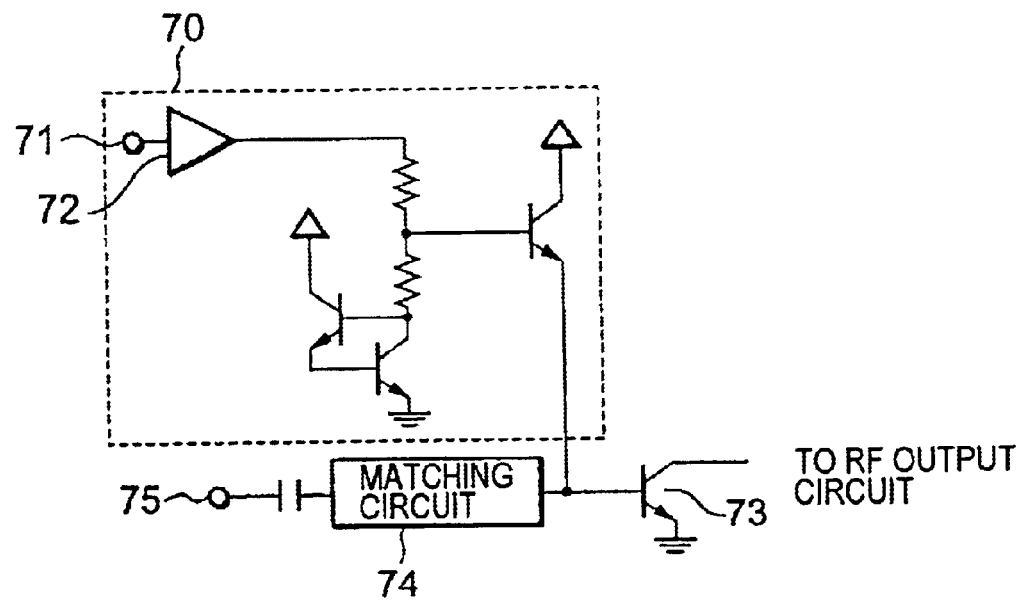
FIG. 9 is the other example of a power amplifier according to this invention.

Referring to FIG. 9, in a base circuit 70, a buffer circuit 72 is newly added to the control terminal 2 of the base bias circuit 15 shown in FIG. 5. Basic operation, function and effect of the semiconductor device illustrated in FIG. 9 are the same as those of the semiconductor device shown in FIG. 5.

By adding the buffer circuit 72, the current flowing to the control terminal 71 becomes low, so that the bias circuit 70 can be sufficiently driven by the use of the control signal generated by an LSI manufactured through the typical CMOS process.

Figure 10:
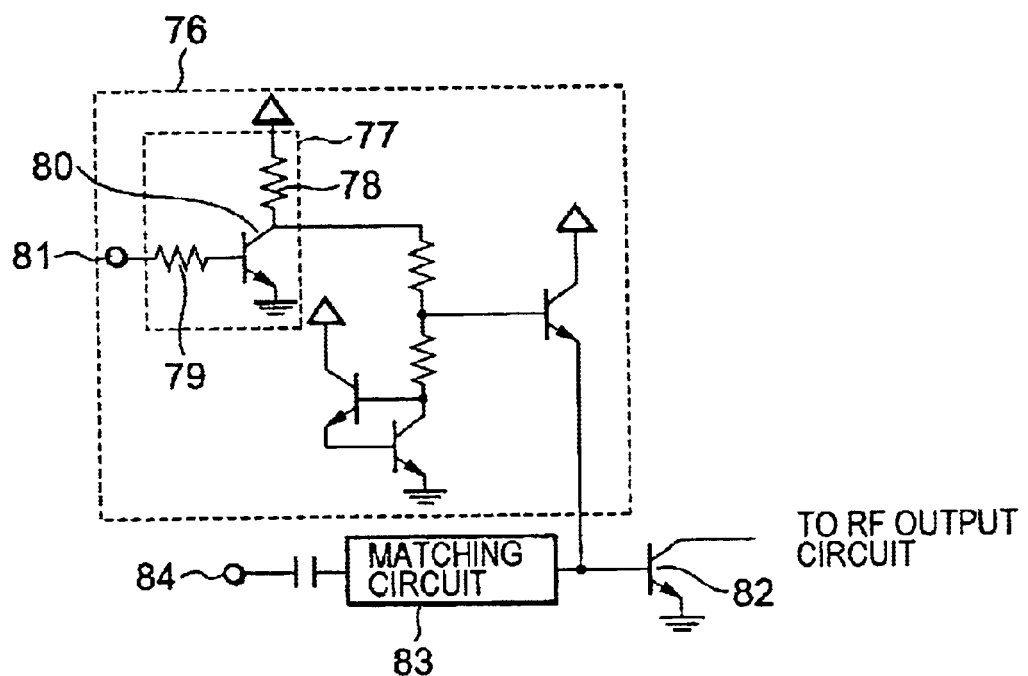
FIG. 10 is the other example of a power amplifier according to this invention.

Referring to FIG. 10, in a base circuit 76, a buffer circuit 77 is newly added to the control terminal 2 of the base bias circuit 15 shown in FIG. 5. Basic operation, function and effect of the semiconductor device illustrated in FIG. 10 are the same as those of the semiconductor device shown in FIG. 5.

The buffer circuit 77 serves as an inverting amplifier consisting of the resistors 78, 79 and the bipolar transistor 80. By adding the buffer circuit 77, the current flowing to the control terminal 71 becomes low, so that the bias circuit 76 can be sufficiently driven by the use of the control signal generated by an LSI manufactured through the typical CMOS process.

Since the buffer circuit 77 is the inverting amplifier, the relationship between the control voltage and the collector bias current of the power transistor 80 is inverted in the base bias circuit 76 in comparison with the base bias circuit 15 shown in FIG. 5.

Figure 11:
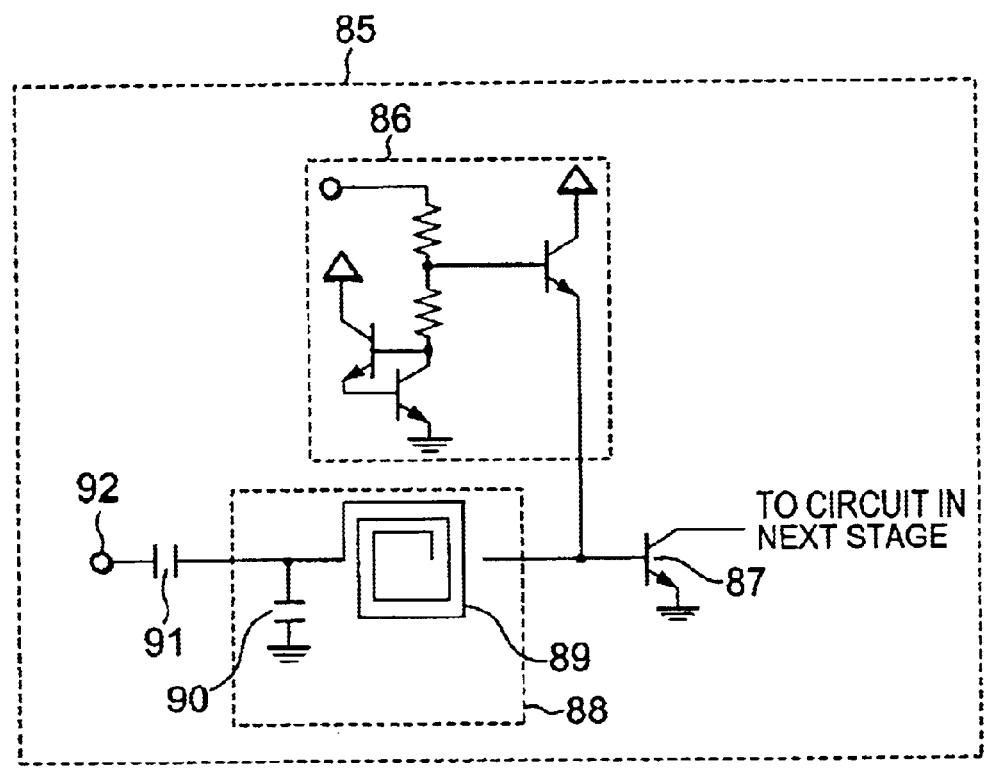
FIG. 11 is the other example of a power amplifier according to this invention.

Referring to FIG. 11, a base bias circuit 86, a power transistor 87, a matching circuit 88, and an MIN capacitor 91 for cutting DC are integrated in the same GaAs substrate 85. As the transistors, npn type GaAs/AlGaAs hetero junction bipolar transistors are totally used. The matching circuit 88 is composed of a spiral inductor 89 and an MIN capacitor 90.

Basic operation, function and effect of the semiconductor device illustrated in FIG. 11 are the same as those of the semiconductor device shown in FIG. 5.

Figure 12:
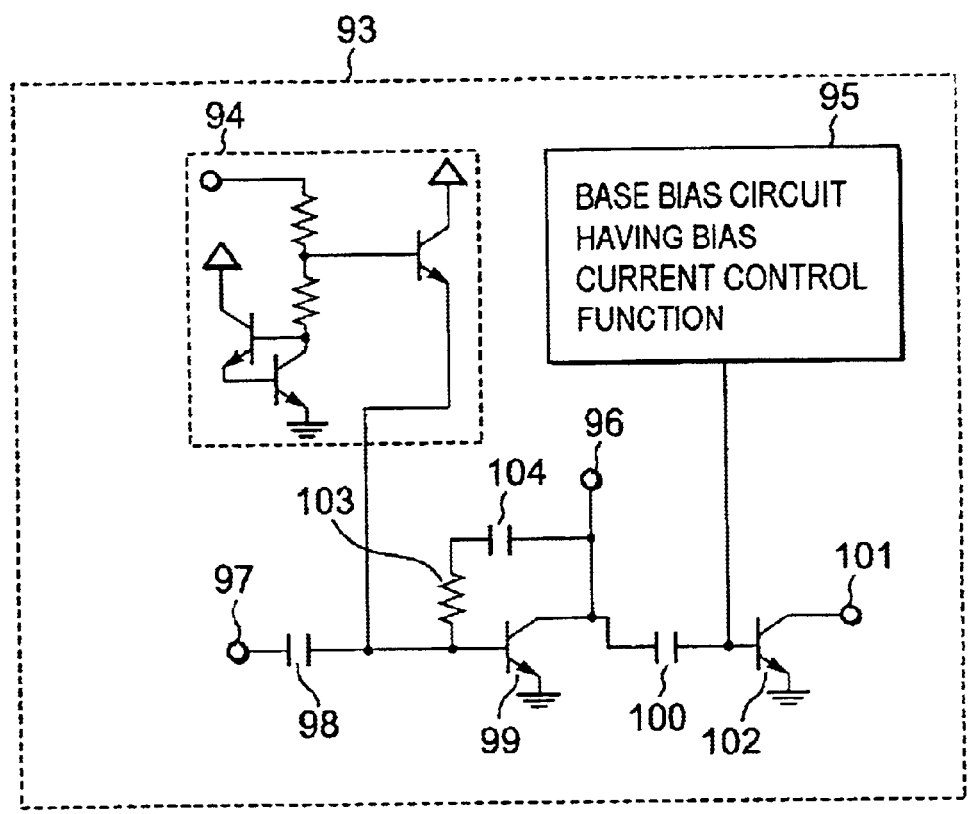
FIG. 12 is the other example of a power amplifier according to this invention.

Referring to FIG. 12, base bias circuits 94, 95, power transistors 99, 102, MIN capacitors 98, 100, 104, and a resistor 103 are integrated on the same Si substrate 93. As the transistors, npn type Si homo junction bipolar transistor are totally used.

The semiconductor device constitutes the MMIC using two stages amplifiers, and the impedance viewed from the RF input terminal 97 in the band of the amplifier is matched to 50 Ω by the operation of a feed back circuit consisting of the resistor 103 and the MIN capacitor 104. The matching between the stages is adjusted by an external circuit added to the connection terminal 96 to the external circuit. The output matching is adjusted by the external circuit connected to the RF output terminal 101. The base bias circuit 95 has the same basic structure as the base bias circuit 94, and the respective circuit constants are optimized in accordance with the difference of the emitter areas of the power transistors 99 and 102. Basic operation, function and effect of the base bias circuits 94 and 95 are the same as those of the base bias circuit 15 shown in FIG. 5.

Industrial Applicability

According to this invention, the chip area and the consumption current can be reduced, and the choke inductor between the base of the power transistor and the bias supply circuit is unnecessary.

What is claimed is:

1. A base bias circuit which supplies a bias current to a base of a common-emitter bipolar transistor of an npn type for a power amplifier, wherein:

the base bias circuit comprises first through third bipolar transistors of an npn type and first and second resistors integrated on a semiconductor substrate and a base bias current control terminal, the first resistor is inserted between the base bias current control terminal and the first bipolar transistor, the second resistor is inserted between a base of the second bipolar transistor and the first bipolar transistor, a base of the second bipolar transistor is connected to a collector of the third bipolar transistor, an emitter of the second bipolar transistor is connected to a base of the third bipolar transistor, an emitter of the third bipolar transistor is grounded, a collector of the first bipolar transistor is connected to a positive power supply, and an emitter of the first bipolar transistor is directly connected to the base of the bipolar transistor for the power amplifier.

2. A base bias circuit as claimed in claim 1, wherein:

a third resistor is inserted between a connection point of the first and second resistor and a base of the first bipolar transistor.

3. A base bias circuit as claimed in claim 2, wherein:

when a resistance of a circuit consisting the first through third resistors and the second and third bipolar transistors, viewed from the base of the first bipolar transistor is defied as R, a mutual conductance of the first bipolar transistor is defined as gm and a common-emitter current amplification factor is defines as h21, an emitter area of the first bipolar transistor and resistances of the first through third resistors are selected such that an impedance given by (1/gm+R/(h21+1)) is higher than an impedance of the base of bipolar transistor for the power amplifier in a predetermined frequency band and is equivalent to an impedance of the base of the bipolar transistor for the power amplifier in a direct current.

4. A base bias circuit as claimed in claim 1, wherein:

the emitter of the third bipolar transistor is grounded via a fourth resistor.

5. A base bias circuit as claimed in claim 1, wherein:

the emitter of the third bipolar transistor is grounded via the fourth resistor, and is short-circuited by the use of a metal wiring instead of the second resistor.

6. A base bias circuit as claimed in claim 1, wherein:

the first and second bipolar transistors are replaced by n-type MOSFETs.

7. A base bias circuit as claimed in claim 1, wherein:

a buffer circuit is inserted between the first resistor and the base bias current control terminal.

8. A base bias circuit as claimed in claim 7, wherein:

the buffer circuit comprises a fourth bipolar transistor of an npn type and fifth and sixth resistors, an emitter of the fourth bipolar transistor is grounded and the base thereof is connected to the base bias current control terminal via the fifth resistor, a collector of the fourth bipolar transistor is connected to the first resistor and the sixth resistor, and the sixth resistor is connected to a power supply terminal.

9. A base bias circuit as claimed in claim 8, wherein:

the forth bipolar transistor is a hetero junction bipolar transistor formed on a chemical substrate.

10. A base bias circuit as claimed in claim 8, wherein:

the fourth bipolar transistor is a Si homo BJT formed on a Si substrate.

11. A base bias circuit as claimed in claim 8, wherein:

the fourth bipolar transistor is a SiGe hetero junction bipolar transistor formed on a Si substrate.

12. A power amplifier, wherein:

the bipolar transistor for the power amplifier is formed on the same semiconductor substrate as the base bias circuit as claimed in claim 1, and the base bias circuit and the bipolar transistor for the power amplifier are connected by a metal wiring formed by a semiconductor production process.

13. A base bias circuit as claimed in claim 1, wherein:

the first through third bipolar transistors are hetero junction bipolar transistors formed on a chemical substrate.

14. A base bias circuit as claimed in claim 1, wherein:

the first through third bipolar transistors are Si homo BJTs formed on a Si substrate.

15. A base bias circuit as claimed in claim 1, wherein:

the first through third bipolar transistors are SiGe hetero junction bipolar transistors formed on a Si substrate.

* * * * *